(12) United States Patent
Cho et al.

(10) Patent No.: US 9,070,478 B2
(45) Date of Patent: Jun. 30, 2015

(54) VARIABLE RESISTIVE MEMORY DEVICE AND METHOD OF FABRICATING THE SAME

(75) Inventors: Mann Ho Cho, Seoul (KR); Ju Heyuck Baeck, Seoul (KR); Tae Hyeon Kim, Seoul (KR); Hye Jin Choi, Bucheon-si (KR)

(73) Assignees: Hynix Semiconductor Inc., Gyeonggi-do (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 13/483,730

(22) Filed: May 30, 2012

(65) Prior Publication Data
US 2013/0141967 A1    Jun. 6, 2013

(30) Foreign Application Priority Data
Dec. 3, 2011    (KR) .................. 10-2011-0128695

(51) Int. Cl.
G11C 11/00    (2006.01)
G11C 11/56    (2006.01)
G11C 13/00    (2006.01)
H01L 45/00    (2006.01)

(52) U.S. Cl.
CPC ........ G11C 11/5678 (2013.01); G11C 13/0004 (2013.01); H01L 45/1233 (2013.01); H01L 45/143 (2013.01); H01L 45/1625 (2013.01); H01L 45/1683 (2013.01); H01L 45/065 (2013.01)

(58) Field of Classification Search
USPC .................. 365/163, 148, 151; 257/E21.068; 438/102
See application file for complete search history.

(56) References Cited

U.S. PATENT DOCUMENTS

| 7,547,913 | B2 | 6/2009 | Yoon et al. |
| 7,586,777 | B2 | 9/2009 | Campbell |
| 8,012,789 | B2 | 9/2011 | Ko et al. |
| 2009/0148649 | A1 | 6/2009 | Shi et al. |
| 2009/0206318 | A1* | 8/2009 | Ko et al. ............................ 257/4 |
| 2010/0144087 | A1* | 6/2010 | Ha et al. ........................ 438/102 |

OTHER PUBLICATIONS

Baeck et al., "Phase Transformation through Metastable Structures in Atomically Controlled Se/Sb Multilayers," The Journal of Physical Chemistry, Jun. 4, 2011, vol. 115, pp. 13462-13470.

* cited by examiner

Primary Examiner — Fernando Hidalgo
(74) Attorney, Agent, or Firm — IP & T Group LLP (57) ABSTRACT

A variable resistive memory device includes an array of a plurality of memory cells. Each of the plurality of memory cells includes first and second electrodes, and an $Sb_mSe_n$ material layer (where m and n are positive numbers, respectively) interposed between the first electrode and the second electrode. The $Sb_mSe_n$ material layer includes a separation structure in which a plurality of Sb atoms are in contact with a plurality of Se atoms.

18 Claims, 10 Drawing Sheets

VARIABLE RESISTIVE MEMORY DEVICE AND METHOD OF FABRICATING THE SAME

CROSS-REFERENCES TO RELATED APPLICATION

The present application claims priority under 35 U.S.C. 119(a) to Korean application number 10-2011-0128695, filed on Dec. 3, 2011, in the Korean Patent Office, which is incorporated by reference in its entirety as if set forth in full.

BACKGROUND OF THE INVENTION

1. Technical Field

The present invention relates to semiconductor technology, and more particularly, to a variable resistive memory device and a method of manufacturing the same.

2. Related Art

As the demand for portable digital application devices such as digital cameras, MP3 players, personal digital assistants (PDAs), and portable phones increases, the market for nonvolatile memories is rapidly expanding. While flash memory devices are exemplary programmable nonvolatile memory devices, they are reaching their physical limits in terms of scaling. Thus, other nonvolatile memory devices such as phase-change random access memory (PcRAM) devices or resistive random access memory (ReRAM) devices using a variable resistor of which a resistance value is reversibly changed are being developed as alternatives to the flash memory devices. Since such nonvolatile memory devices use, for example, a resistance value change of the variable resistor to store a data state, a configuration of a cell becomes simple and thus miniaturization of the memory device becomes easier.

More specifically, PcRAM devices include memory cells that each include a phase-change material layer, which is reversibly switchable between a crystalline state having a low resistance value (referred to as a SET state) and an amorphous state having a relatively high resistance value (referred to as a RESET state). PcRAM devices operating as variable resistive memory devices may be realized by assigning logic values to different resistive states and reading out a resistance difference of each memory cell.

Currently, a germanium-antimony-tellurium (Ge—Sb—Te)-based alloy, which is a chalcogenide compound (for example, a $Ge_2Sb_2Te_5$ alloy), has been developed as a phase-change material. Since the Ge—Sb—Te-based material has advantages of fast and stable phase-change and good oxidation resistance, the Ge—Sb—Te-based material is suitable for the PcRAM devices. However, since the Ge—Sb—Te-based material has only two kinds of resistance values corresponding to a set state and a reset state, one bit of data is stored in each cell. Thus, it is desirable to develop phase-change materials capable of storing 2 bits or more per cell and increase recording capacity of the variable resistive memory device.

SUMMARY

One or more exemplary embodiments are directed to a variable resistive memory device using a phase-change material layer, which may improve an information storage density.

One or more exemplary embodiments are directed to a method of manufacturing a variable resistive memory device using a phase-change material layer capable of improving information storage density.

According to one aspect of an exemplary embodiment, there is a provided a variable resistive memory device including an array of a plurality of memory cells. Each of the plurality of memory cells may include first and second electrodes, and an $Sb_mSe_n$ (where m and n are positive numbers, respectively) material layer interposed between the first electrode and the second electrode. The $Sb_mSe_n$ material layer may include a separation structure in which a plurality of Sb atoms are in contact with a plurality of Se atoms.

According to another aspect of an exemplary embodiment, there is a provided a variable resistive memory device including first and second electrodes and an $Sb_mSe_n$ material layer interposed between the first electrode and the second electrode. First bit information may be allocated to a first resistance value by an $Sb_4Se_4$ monoclinic crystal structure generated by applying a first set pulse to the $Sb_mSe_n$ material layer. In addition, in the variable resistive memory device, second bit information may be allocated to a second resistance value by an $Sb_2Se_3$ orthorhombic crystal structure generated by applying a second set pulse to the $Sb_mSe_n$ material layer.

According to another aspect of an exemplary embodiment, there is a provided a method of manufacturing a variable resistive memory device. The method may include: forming a first electrode; forming an $Sb_mSe_n$ material layer on the first electrode; and forming a second electrode on the $Sb_mSe_n$ material layer. The $Sb_mSe_n$ material layer may include separation structure in which a plurality of Sb atoms are in contact with a plurality of Se atoms.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Hereinafter, exemplary embodiments will be described in greater detail with reference to the accompanying drawings.

The present invention, however, may be embodied in many different embodiment and should not be construed as being limited to the embodiments set forth herein; rather, these embodiments are provided so that this disclosure will be thorough and complete, and will fully convey the concept of the invention to those skilled in the art.

In the drawings, like numbers refer to like elements. As used herein, a term "and/or" includes any one of listed items and all combinations of two or more thereof.

The terminology used herein is for the purpose of describing particular embodiments only and is not intended to limit the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or the group thereof, but do not preclude the presence or addition of one or more other features, integers, steps, operations, elements, components, and/or groups thereof.

It is also understood that when a layer is referred to as being "on" another layer or substrate, it can be directly on the other or substrate or intervening layers or layers formed in the intervening layers may also be present. It will be clearly understood by those skilled in the art that a structure or shape "adjacent to" another shape may have a portion overlapping the other shape or a portion below the other shape.

Spatially relative terms, such as "below", "above", "upper", "lower" "horizontal", or "vertical", may be used herein for ease of description to describe one element, layer, or region's relationship to another element(s), layer(s), or region(s) as illustrated in the figures. It will be understood that the spatially relative terms are intended to encompass different orientations of the device in use or operation in addition to the orientation depicted in the figures.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be include deviations in shapes that result, for example, from manufacturing. In the drawings, lengths and sizes of layers and regions may be exaggerated for clarity. Like reference numerals in the drawings denote like elements.

Herein, a term "substrate" is collectively referred to as a base structure such as silicon, silicon-on-insulator (SOI), or silicon-on-sapphire (SOS), a semiconductor layer formed on another base structure other than semiconductor, doped or undoped semiconductor layer, or a modified semiconductor layer. Terms "base structure" and "semiconductor" are not limited to a silicon-based material and may include carbon, polymer, or a group III-V semiconductor material such as silicon-germanium (SiGe), Ge, a gallium-arsenide (GaAs)-based compound material, a group II-VI semiconductor material, or a mixed semiconductor material.

Herein, a term "stoichiometry" is referred to as a quantitative relationship of an atom concentration between two substances in a phase-change material layer having a predetermined volume and may be measured using, for example, Rutherford backscattering spectrometry (RBS), energy dispersive X-ray spectroscopy or the like thereto.

In addition, herein, a term "phase-change" is not limited to a phase-change between a perfect crystalline state and a perfect amorphous state. The term "phase-change" encompasses phase-change between different states sufficient to detect a difference within the full spectra of crystalline states and the full spectra of amorphous states. In addition, a phase-change may occur entirely or partially in a phase-change material layer.

Figure 1A:
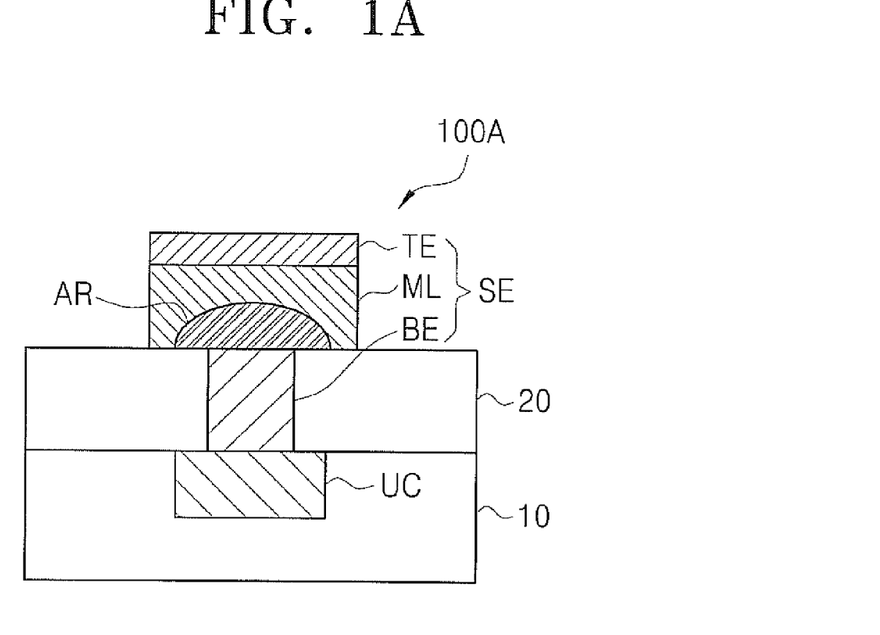
FIGS. 1A to 1C are cross-sectional views illustrating memory cells of variable resistive memory devices according to various exemplary embodiments of the present invention.
Figure 1B:
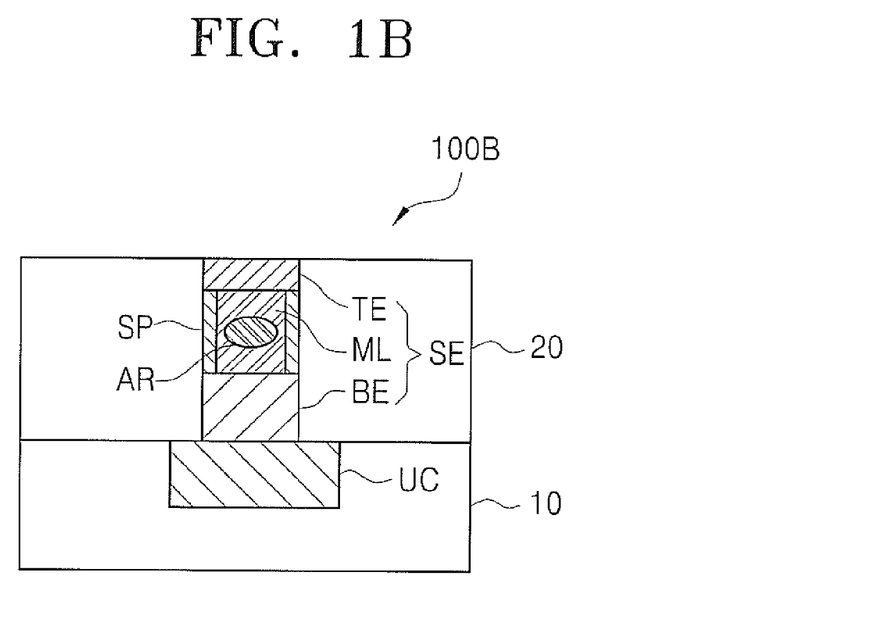
Figure 1C:
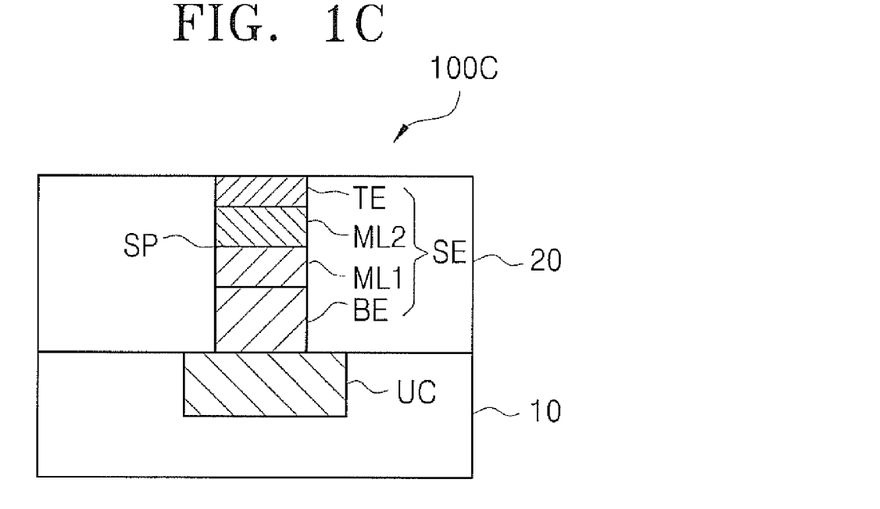

FIGS. 1A to 1C are cross-sectional views illustrating memory cells SE of variable resistive memory devices 100A, 100B, and 100C according to various exemplary embodiments of the present invention.

Referring to FIG. 1A, the memory cell SE may have a mushroom-shaped structure including a first electrode BE, a second electrode TE, and a phase-change material layer ML interposed between the first and second electrodes BE and TE. A width of the first electrode BE may be smaller than those of the second electrode TE and the phase-change material layer ML. A contact area between the first electrode BE and the phase-change material layer ML may be smaller than that between the second electrode TE and the phase-change material layer ML. Therefore, when a programming voltage is applied between the first electrode BE and the second electrode TE, a current density is maximized in vicinity of the first electrode BE so that a mushroom-shaped active region AR may be formed in the phase-change material layer ML.

The phase-change material layer ML may include an $Sb_m$-$Se_n$ (where m and n are positive numbers, respectively) material layer. The $Sb_mSe_n$ material layer may be a layer of which a stoichiometry satisfies m:n. The $Sb_mSe_n$ material layer may satisfy m>n to be Sb-rich $Sb_mSe_n$. According to another example, the stoichiometry m:n of the $Sb_mSe_n$ material layer is m=n to be at 1:1 ratio. The features and advantages of the present invention related to the stoichiometry will be described with reference to FIG. 3.

The $Sb_mSe_n$ material layer may include a first surface comprising a plurality of Sb atoms and a second surface comprising a plurality of Se atoms, and the first surface and the second surface are in contact with each other so that the plurality of Sb atoms and the plurality of Se atoms may be phase-separated. In this case, a contact interface (see IS of FIGS. 2A and 2B) having a long range order of about 100 Å may be formed inside the $Sb_mSe_n$ material layer. Such a structure may be distinguished from an Sb—Se alloy structure in which Sb atoms are bonded to Se atoms.

In the separation structure, the plurality of Sb atoms providing the first surface may have a first layer structure, the a plurality of Se atoms providing the second surface may have a second layer structure, and the first and second layer structures may come in contact with each other to form the contact interface. In other exemplary embodiments, the separation structure may be provided by providing the plurality of Se atoms providing the second surface as a matrix and segregating the plurality of Sb atoms providing the first surface inside the matrix. The plurality of segregated Sb atoms includes an Sb trigonal crystal structure.

The stoichiometry and separation structure of the $Sb_mSe_n$ material layer may be satisfied over the entire structure of the phase-change material layer or alternatively, satisfied over, for example, only the active region AR where programming occurs. In some exemplary embodiments, the separation structure has a first resistance value and thus bit information of the memory device may be allocated thereto. For example, since the structure is macroscopically a disordered structure, the first resistance value may be a value of a high resistance state (reset state) corresponding to an amorphous structure. However, the bit information allocation is merely an example and the bit information may not be allocated according to an operation of the memory device.

The first electrode BE may pass through an interlayer insulating layer 20 and be electrically connected to a lower circuit unit UC formed in a substrate 10. The lower circuit unit UC may include a switching element configured to access to the memory cell SE, for example, a transistor, a diode, and a lower interconnection structure such as a word line. For example, the first electrode BE may include another material suitable for serving as a barrier layer configured to prevent reaction between the lower circuit unit UC (for example, contact pads) and the phase-change material layer ML. Here, the second electrode TE may be connected to a bit line (not shown). Alternatively, the second electrode TE may be a portion of the bit line or the bit line itself.

Each of the first electrode BE and the second electrode TE may include at least one selected from the group consisting of platinum (Pt), ruthenium (Ru), lanthanum (La), chromium (Cr), iridium (Ir), silver (Ag), aluminum (Al), titanium (Ti), tantalum (Ta), tungsten (W), silicon (Si), copper (Cu), nickel (Ni), cobalt (Co), molybdenum (Mo), conductive nitride thereof (for example, titanium nitride (TiN), tungsten nitride (WN), molybdenum nitride (MoN), tantalum nitride (TaN), titanium aluminum nitride (TiAlN), tantalum aluminum nitride (TaAlN), and the like), conductive oxynitride thereof (for example, titanium oxynitride (TiON), and the like), and a combination thereof (for example, titanium silicon nitride (TiSiN), titanium aluminum oxynitride (TiAlON), and the like). However, the above-described materials are merely an example and electrode materials are not limited to the above-described materials. For example, the first and second electrodes BE and TE may include doped Si, C or Ge.

Referring to FIG. 1B, the memory cell SE may have a pillar shape including a first electrode BE, a second electrode TE, and a phase-change material layer ML interposed between the first electrode BE and the second electrode TE. An interlayer insulating layer 20 may entirely surround the pillar structure. In the other exemplary embodiments, the second electrode TE may be formed so that a portion of the second electrode TE is partially buried within the interlayer insulating layer 20 and a remaining portion of the second electrode TE extends to and over the interlay insulating layer 20 or so that an upper surface of the phase-change material layer ML has substantially the same level as an upper surface of the interlayer insulating layer 20 and thus the second electrode TE extends to the interlayer insulating layer 20.

As in FIG. 1A, the first electrode BE may be electrically connected to a lower circuit unit UC. In exemplary embodiments, a spacer SP may be further formed between the interlayer insulating layer 20 and the phase-change material layer ML to reduce a magnitude of a programming current. In the memory cell SE having the pillar structure, an active region AR may be formed inside the phase-change material layer ML and is spaced apart from both the first electrode BE and the second electrode TE. As described above with reference to FIG. 1A, the $Sb_mSe_n$ material layer may be provided entirely in the phase-change material layer ML or locally in the active region AR.

Referring to FIG. 1C, the memory cell SE may include a plurality of phase-change material layers ML1 and ML2. A first phase-change material layer ML1 of the plurality of phase-change material layers ML1 and ML2 may be the $Sb_mSe_n$ material layer in FIGS. 1A and 1B, and a second phase-change material layer ML2 may be connected to the $Sb_mSe_n$ material layer in series to provide a resistive state to store additional data bit information. For example, the second phase-change material layer ML2 may include another kind of phase-change material layer having a resistance value distinguished from the $Sb_mSe_n$ material layer. The first phase-change material layer ML1 and the second phase-change material layer ML2 may be stacked in different ways from the way described above (for example, reversely stacked from the above-described way).

In some exemplary embodiments, the second phase-change material layer ML2 may include, for example, a chalcogenide compound such as $Ge_2Sb_2Te_5$, $In_{0.5}Sb_2Te_{2.9}$, $Sb_2Te_3$, or $Ge_{7.5}Sb_{9.5}$, but the present invention is not limited thereto. For example, the second phase-change material layer ML2 may include another chalcogenide compound such as $GeSb_2Te_3$ or $GeSb_2Te_4$. Alternatively, the second phase-change material layer ML2 may include any one selected from the group consisting of BiSe, GeTeAs, GeSnTe, SeSnTe, GaSeTe, GeTeSnAu, $SeSb_2$, InSe, GeTe, BiSeSb, PdTeGeSn, InSeTiCo, InSbTe, $In_3SbTe_2$, $GeTeSb_2$, $GeTe_3Sb$, GeSbTePd, and AgInSbTe. In addition, the above-described phase-change material may be further doped with a non-metal atom or an insulating material, for example, boron (B), carbon (C), nitrogen (N), phosphor (P), or the like.

As long as the above-described exemplary embodiments are not inconsistent with each other, the exemplary embodiments may be combined with each other or compatibly modified. For example, in the memory cell structure of FIG. 1C, the spacer SP of FIG. 1B may extend onto sidewalls of one or both of the first phase-change material layer ML1 and the second phase-change material layer ML2. Alternatively, the spacer SP may be formed on a surface of the first electrode BE to restrict a contact area between the first electrode BE and the phase-change material layer ML of FIG. 1A so that the first electrode BE may have a width of below a limit of a photolithographic process. The additional phase-change material layer ML2 may extend onto an interlayer insulating layer 20 as the phase-change material layer ML of FIG. 1A.

Figure 2A:
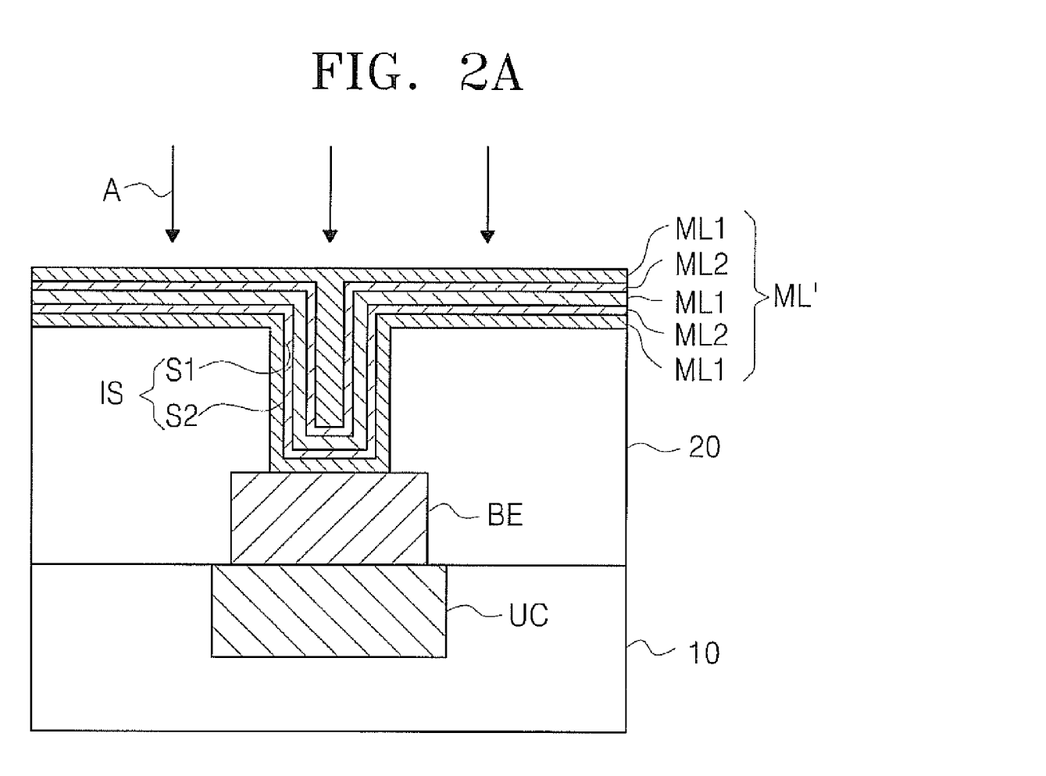
FIGS. 2A and 2B are cross-sectional views illustrating a method of manufacturing a variable resistive memory device including a memory cell according to various exemplary embodiment of the present invention.
Figure 2B:
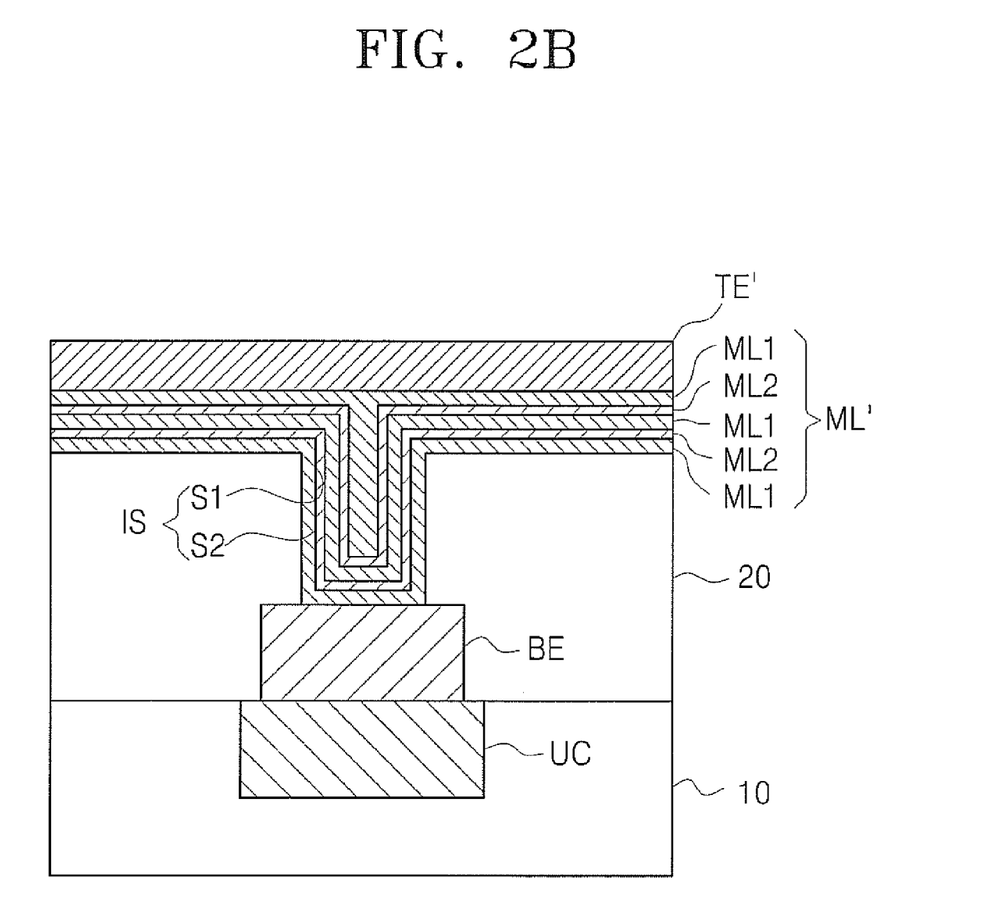

FIGS. 2A and 2B are cross-sectional views illustrating a method of manufacturing a variable resistive memory device including a memory cell according to various exemplary embodiments of the present invention. As to members having the same reference numerals as the above-described members among members of FIGS. 2A and 2B, the above description applies to the extent that the description is not inconsistent with the embodiments shown in FIGS. 2A and 2B.

Referring to FIG. 2A, a substrate 10 may be provided. A lower circuit unit UC including a switching element or a lower interconnection structure configured to access the memory cell (SE of FIGS. 1A to 1C) may be formed in the substrate 10. As to a method of forming the lower circuit unit UC, any reasonably suitable method of forming switching element such as a diode or a transistor and any reasonably suitable method of forming an interconnection may be used.

A first electrode BE may be formed on the substrate 10. An insulating layer such as a silicon oxide layer or a silicon nitride layer is formed on the substrate 10 in which the first electrode BE is formed. A photolithographic and etching process is performed on the insulating layer to form an interlayer insulating layer 20 having a contact hole exposing a surface of the first electrode BE.

In the exemplary embodiment, the interlayer insulating layer 20 is formed after the first electrode BE is formed. However, the exemplary embodiment is merely an example and the present invention is not limited thereto. For example, after the interlayer insulating layer is formed, a contact hole exposing a contact of the lower circuit unit UC is formed in the interlayer insulating layer 20, and an appropriate electrode material is filled within the contact hole and recessed so that the first electrode BE having the structure as shown in FIGS. 1A to 1C may be obtained.

Subsequently, a phase-change material layer ML' is formed on the substrate 10 to fill the contact hole formed in the interlayer insulating layer 20. The phase-change material layer ML' may be formed by alternately depositing a plurality of Sb atoms ML1 and a plurality of Se atoms ML2 for one or more times. Here, the plurality of Sb atoms ML1 and the plurality of Se atoms may be formed in layer structures, respectively and phase-separated in the phase-change material layer ML'. The layers ML1 and ML2 in the phase-change material layer ML' may have a first surface S1 and a second surface S2, respectively, in the phase-change material layer ML', and the surfaces S1 and S2 may form at least one continuous contact interface IS within the phase-change material layer ML'.

To form the stacked phase-change material layer ML', a physical vapor deposition method having a good step coverage and capable of controlling growth of an atomic layer level such as an effusion cell method, an molecular beam epitaxy (MBE) method, and an atomic layer deposition (ALD) method may be used. According to an example, the effusion cell method or MBE method capable of controlling a thin film growth rate within several Å per second may be used. According to the exemplary embodiment, since the plurality of Sb atoms ML1 and the plurality of Se atoms ML2 constituting the phase-change material layer ML' is to be phase-separated, a thin film forming process such as a chemical vapor deposition for forming a thin film in equilibrium of Sb—Se or co-sputtering of Sb—Se is not preferable.

The stoichiometry of Sb—Se in the phase-change material layer ML' may be controlled by relatively adjusting thicknesses of the layers ML1 and ML2 thereof. To form a Se-rich material layer such as $Sb_4Se_6$, the Se layer ML1 may be formed to a thickness of about 8.84 Å and the Sb layer ML2 may be formed to a thickness of 12.6 Å. Similarly, to form a phase-change material layer having 1:1 ratio such as $Sb_4Se_4$, the Sb layer ML1 may be formed to a thickness of about 8.84 Å and the Se layer ML2 may be formed to a thickness of 7.2 Å. To form Sb-rich material layer such as $Sb_6Se_4$, the Sb layer ML1 may be formed to a thickness of about 15.4 Å and the Se layer ML2 may be formed to a thickness of 7.2 Å.

In some embodiments, before the second electrode TE' is formed, a planarization process is performed on the phase-change material layer ML' as indicated by an arrow A. The planarization process may be performed by a chemical mechanical polishing (CMP) process or an etch-back process. The planarization process may be performed until an upper surface of the phase-change material layer ML' has the same level as an upper surface of the interlayer insulating layer 20. Subsequently, a second electrode TE' electrically connected to the phase-change material layer ML' is formed so that a memory cell is completed.

In other exemplary embodiments, after the planarization process, the phase-change material layer ML' may be further recessed toward the inside of the contact hole to form a groove in the contact hole and subsequently another phase-change material layer (see ML2 of FIG. 1C) and/or the second electrode TE may be formed.

As appropriate, after the phase-change material layer ML' is formed in the contact hole, a reflow process may be performed. In this case, the reflow process may be performed in a limited temperature range to prevent a loss of a contact interface of Sb/Se within the phase-change material layer ML'.

In some exemplary embodiments, the phase-change material layer ML' may further include a buffer layer (not shown). For example, when a stacked structure of the Sb layer ML1/the Se layer ML2 is completed, the buffer layer may be provided. The buffer layer may serve as a diffusion barrier layer which restricts a diffusion direction of atoms between the Sb layer and Se layer when the memory cell is driven. In addition, the buffer layer may concentrate Joule heat for programming inside the phase-change material layer. In this case, the buffer layer may include germanium-antimony (GeSb), which includes Sb as an element.

Referring to FIG. 2B, a phase-change material layer ML' may be formed as shown in FIG. 2A followed by the formation of a conductive layer TE' for a second electrode. Subsequently, an etch mask layer (not shown) may be formed on the conductive layer TE' and the phase-change material layer ML', and the phase-change material layer ML' and the conductive layer TE' may be consecutively etched using the etch mask layer so that a memory cell in which the phase-change material layer ML' and the conductive layer TE' have the same width may be formed.

While the exemplary embodiment in FIGS. 2A and 2B illustrates a method of forming the phase-change material layer in the contact hole, the present invention is not limited to the above-described method. For example, on the substrate 10 in which the first electrode BE is exposed from an upper surface of the interlayer insulating layer 20, as described above, the plurality of Sb atoms ML1 and the plurality of Se atoms ML2 may be alternately deposited for one or more times, and the second electrode TE may be formed on a resultant structure and subsequently patterned so that the memory cell structure as shown in FIG. 1A may be obtained.

Figure 3:
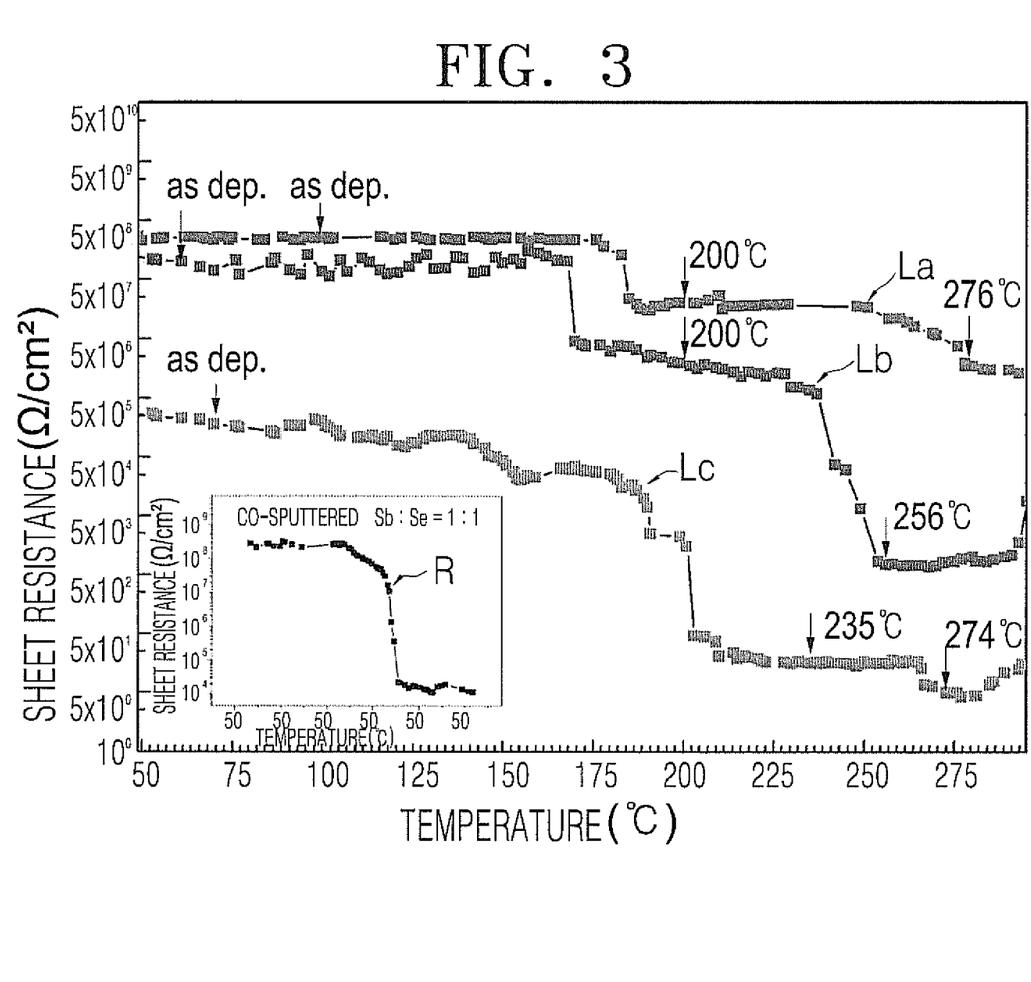
FIG. 3 is a graph representing sheet resistance dependence with respect to temperatures of memory cells according to various exemplary embodiments and comparative examples of the present invention.

FIG. 3 is a graph representing dependence of a sheet resistance with respect to temperatures of memory cells according to various exemplary embodiments and comparative examples according to the present invention. In FIG. 3, curves La, Lb, and Lc are analysis results of memory cells using a Se-rich $Sb_4Se_6$ material layer (hereinafter, referred to as a phase-change material layer of a first embodiment), an $Sb_4Se_4$ material layer satisfying a ratio of 1:1 (hereinafter, referred to as a phase-change material layer of a second embodiment), and an Sb-rich $Sb_6Se_4$ material layer (hereinafter, referred to as a phase-change material layer of a third embodiment), respectively. A curve R is an analysis result of a memory cell using an $Sb_4Se_4$ alloy layer satisfying a ratio of 1:1 and deposited by co-sputtering of Sb—Se to be compared with the first to third embodiments.

Each of the phase-change material layers in the first to third embodiments includes a separation structure having a continuous contact interface of a long range order between the alternately stacked plurality of Sb atoms and the plurality of Se atoms in layers, respectively, as described with reference to FIGS. 2A and 2B. The $Sb_4Se_4$ alloy layer (curve R) according to the comparative example are distinguished from the phase-change material layers of the first to third embodiments in that the Sb atoms and the Se atoms are mixed within the alloy layer and thus a continuous contact interface having a long range order is not preset.

Referring to FIG. 3, as an annealing temperature of a memory cell fabricated in a range from a room temperature to 300° C. is increased, sheet resistances in all the phase-change material layers of the first to third embodiments and the $Sb_4Se_4$ alloy layer are changed from a high resistance state into a low resistance state. The phase-change material layer (curve La) of the first embodiment represents a difference in a resistance value from about 500 MΩ to about 30 MΩ. On the contrary, the phase-change material layer (curve Lb) of the second embodiment represents a large difference in a resistance value from about 200 MΩ to about 1.7 KΩ. The phase-change material layer (curve Lc) of the third embodiment represents a large difference in a resistance value from about 3 MΩ to about 10Ω.

Since a read margin is increased as the difference in a resistance value is increased, a stoichiometry m:n of the $Sb_m$-$Se_n$ material layer may be m=n or m>n including stoichiometries of the phase-change material layers in the second embodiment and the third embodiment. It is noteworthy that a resistance value in the phase-change material layer of the third embodiment after the phase-change is equivalent to a resistance value of an Sb bulk material. Meanwhile, it can be seen that a resistance value of the phase-change material layer in the first embodiment is 30 MΩ and thus similar to a resistance value of a reported $Sb_2Se_3$ layer having an orthorhombic structure.

As described above, all the phase-change material layers of the first to third embodiments underwent a first-stage resistance change obtained at a temperature of 200° C. or below and a second-stage resistance change obtained at a temperature between 250° C. and 280° C. Among the phase-change material layers of the first to third embodiments, the phase-change material layer of the second embodiment represents two resistance change levels which has a large difference in a resistance value from 200 MΩ to 30 MΩ (the first-stage resistance change) and from 30 MΩ to 1.7 KΩ (the second-stage resistance change) and a critical temperature of the first-stage resistance change is a relatively low temperature of 170° C. Therefore, more preferably, it can be seen that the stoichiometry m:n of the $Sb_mSe_n$ material layer may be m=n.

Differently from the first to third embodiments, the phase-change material layer (curve R) of the comparative example represents a first-stage resistance change when annealing is performed starting from a room temperature to 300° C. In particular, when the comparative example is compared with the phase-change material layer having the same stoichiometry of the second embodiment, the phase-change material layer of the comparative example underwent phase-change at a relatively high temperature of about 235° C. Thus, it can be seen that the phase-change materials of the first to third embodiments of the present invention have the two-staged resistance changes due to a new metastable secondary crystalline phase which is not represented in the phase-change material layer of the comparative example and the separation structure including the contact interface is advantageous to generate the secondary crystalline phase. Hereinafter, the new metastable secondary crystalline phase may be further disclosed.

Figure 4A:
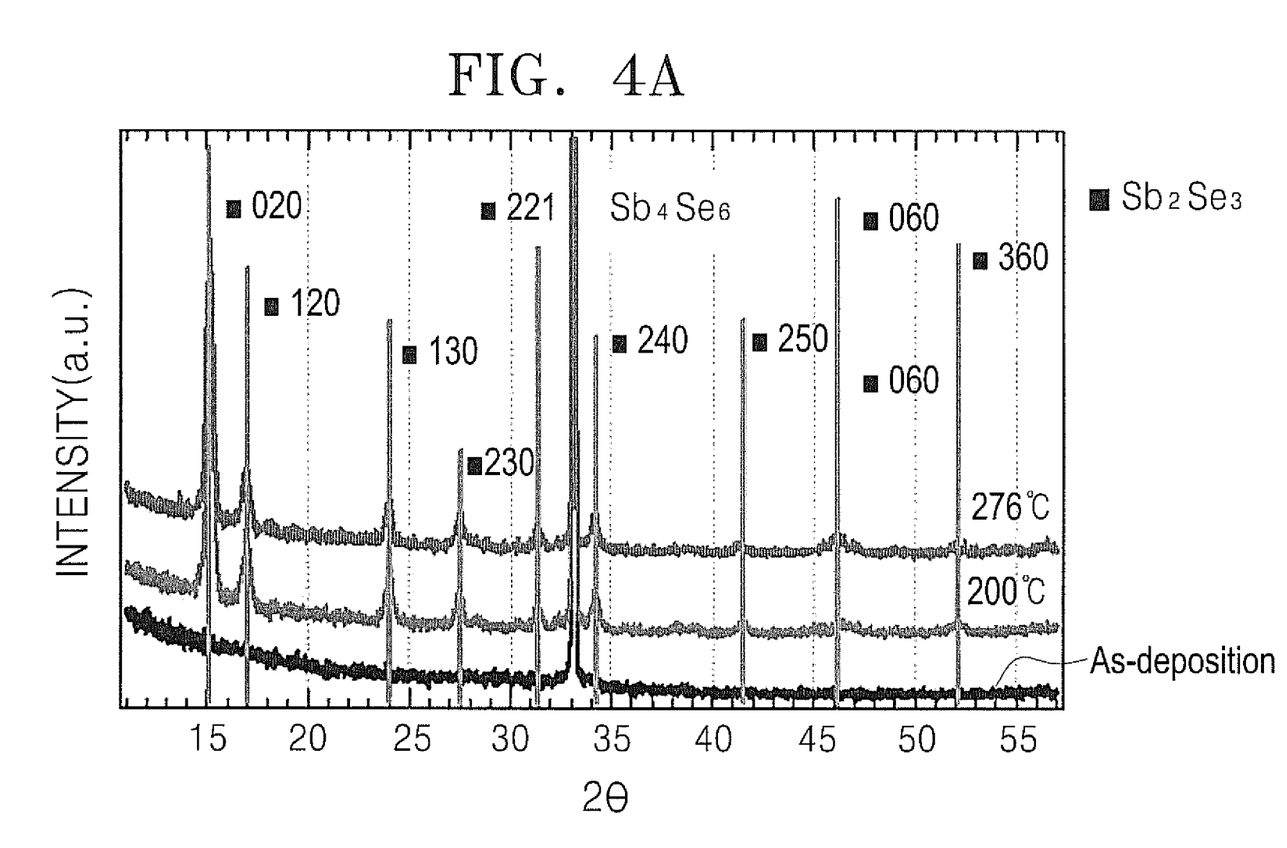
FIGS. 4A to 4D are X-ray diffraction pattern images in respective temperature ranges (temperatures indicated by arrows of FIG. 3) in which a deposition state and resistance change of each of phase-change material layers occur.
Figure 4B:
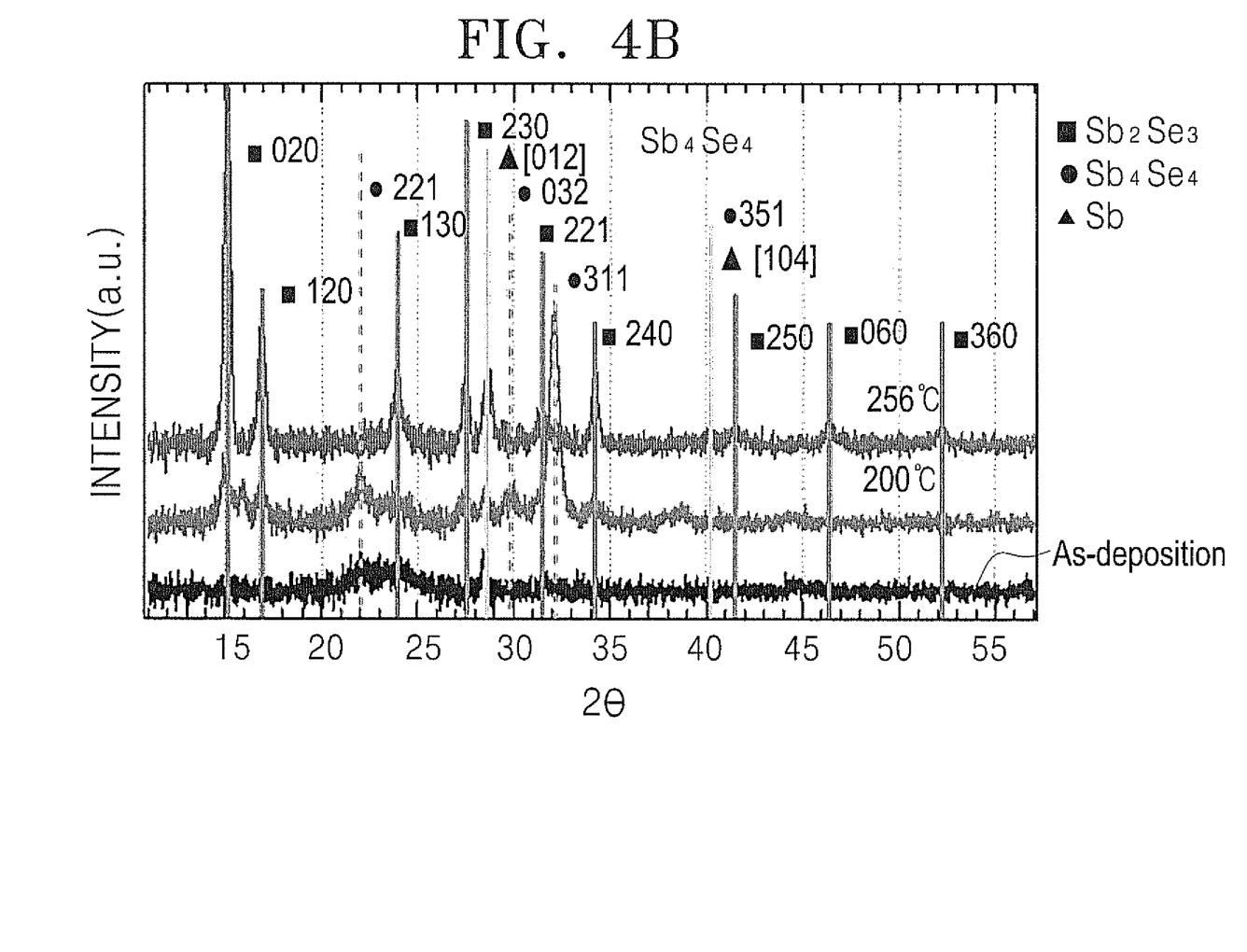
Figure 4C:
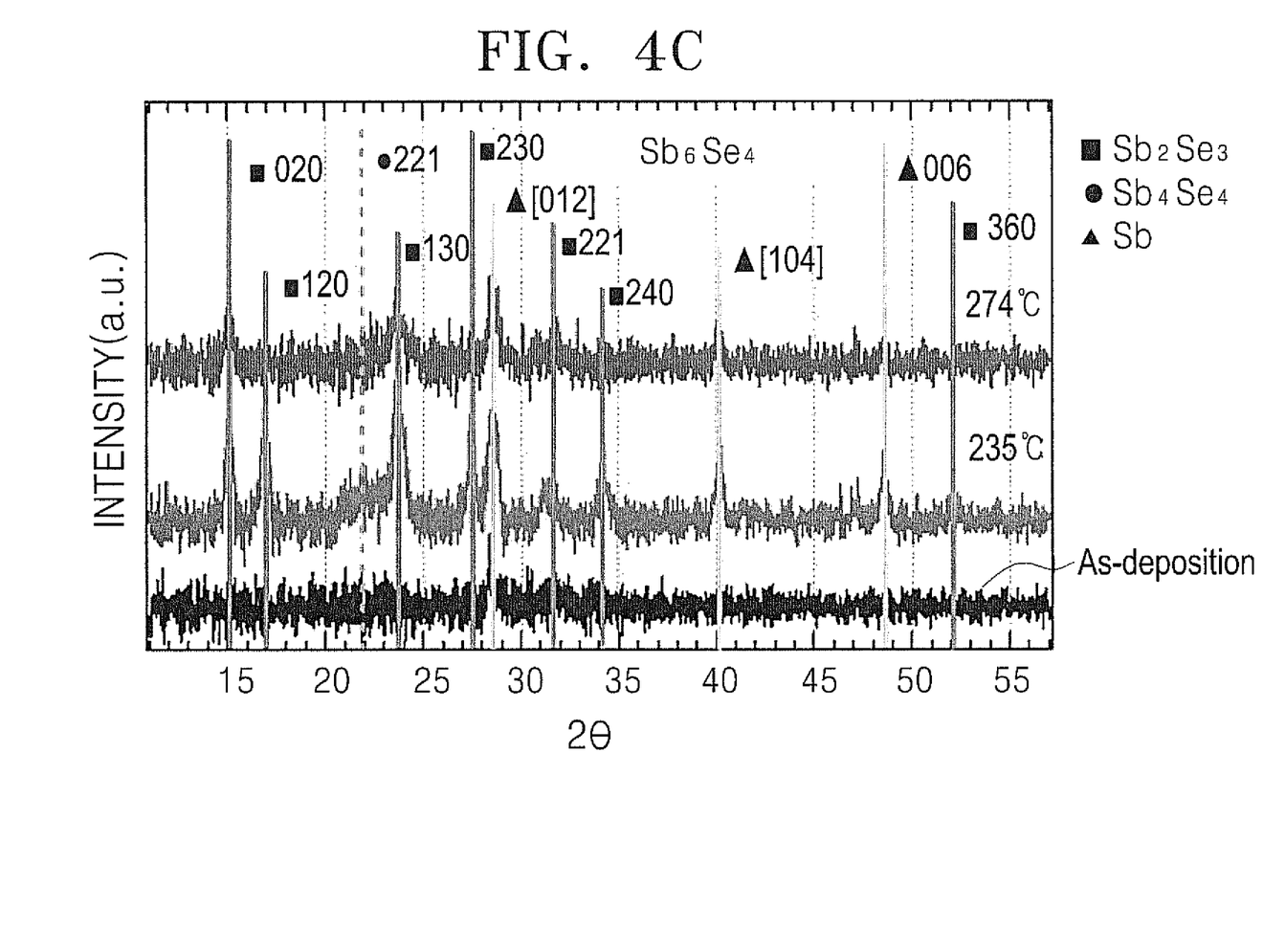
Figure 4D:
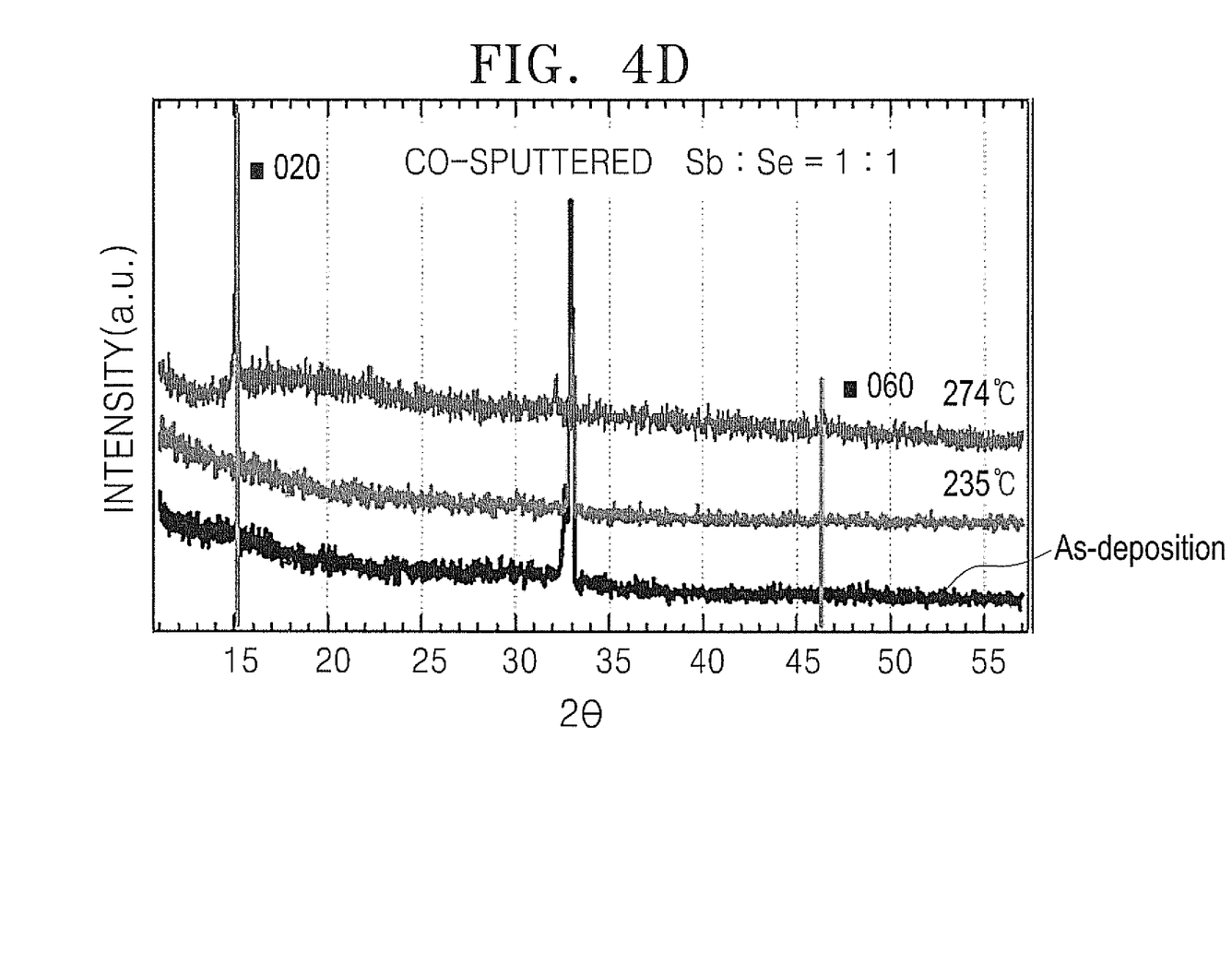

FIGS. 4A to 4D illustrate X-ray diffraction pattern images in temperature ranges (temperatures indicated by arrows) in which a deposition state and resistance change of each of the phase-change material layers occur. FIGS. 4A to 4C show pattern images of the phase-change material layers of the first to third embodiments described with reference to FIG. 3, and FIG. 4D shows a pattern image of the $Sb_4Se_4$ alloy layer of the comparative example of FIG. 3. In graphs of FIGS. 4A to 4D, a peak indicated by a square ■ is a characteristic peak of an $Sb_2Se_3$ orthorhombic crystal structure, a peak indicated by a circle ● is a characteristic peak of an $Sb_4Se_4$ momoclinic crystal structure, and a peak of a triangle ▲ is a characteristic peak of Sb rhombohedral crystal structure.

Referring to FIG. 4A, in the phase-change material layer of the first embodiment, for example, only a characteristic of the $Sb_2Se_3$ orthorhombic crystal structure in temperatures belonging to a first-stage resistance change period and a second-stage resistance stage period, in which resistance change is represented, is observed. This is identical to the situation that the phase-change material layer of the first embodiment has the same sheet resistance as a known sheet resistance of $Sb_2Se_3$ having an orthorhombic crystal structure. In addition, it can be seen that the generated stoichiometry of the $Sb_2Se_3$ orthorhombic crystal structure is identical with an initial stoichiometry when the phase-change material layer of the first embodiment is formed.

Regardless of the observation of, for example, only the characteristic peak of the $Sb_2Se_3$ orthorhombic crystal structure in the phase-change material layer of the first embodiment, as described with reference to FIG. 3, the phase-change material layer of the first embodiment has the two-staged resistance changes. It is considered because the dominant $Sb_2Se_3$ orthorhombic crystal structure and another metastable crystalline phase are generated to some extent within the phase-change material layer. However, it can be seen that the metastable crystalline structure is not dominant from the fact that the resistance change due to the generation is not large.

Referring to FIGS. 4B and 4C, in the phase-change material layers of the second and third embodiments, characteristic peaks of $Sb_2Se_3$ orthorhombic crystal structure and the $Sb_4Se_4$ monoclinic crystal structure are observed. In particular, in the phase-change material layer of the second embodiment, the characteristic peak of the $Sb_4Se_4$ monoclinic crystal structure is significantly observed in a temperature of 200° C. corresponding to the first stage resistance change period. The characteristic peak disappears at a temperature of 256° C., which is the second stage resistance change period, and the characteristic peaks of $Sb_2Se_3$ orthorhombic crystal structure and the Sb rhombohedral crystal structure are observed. The characteristic peak of the Sb rhombohedral crystal structure is attributed to a crystal structure formed by segregating Sb atoms remaining in the phase-change material layer after the stable $Sb_2Se_3$ orthorhombic crystal structure is formed.

Referring to FIG. 4D, in the $Sb_4Se_4$ alloy layer of the comparative example not including the contact interface provided from the separation structure of Sb atoms/Sb atoms, although the stoichiometry of the initial alloy layer before annealing is 1:1 and a thermodynamically stable $Sb_2Se_3$ orthorhombic crystal structure is observed, for example, a characteristic peak of the $Sb_4Se_4$ monoclinic crystal structure as shown in FIG. 4B does not occur.

It can be seen from the X-ray diffraction results that the two-staged resistance changes of the $Sb_mSe_n$ material layer are attributed to the metastable crystalline phase having the $Sb_4Se_4$ monoclinic crystal structure which starts to be crystallized at a temperature of about 170° C. Therefore, a variable resistive memory device capable of multi-bit operation by allocating bit information to a resistance value of the metastable crystalline phase may be provided.

Figure 5:
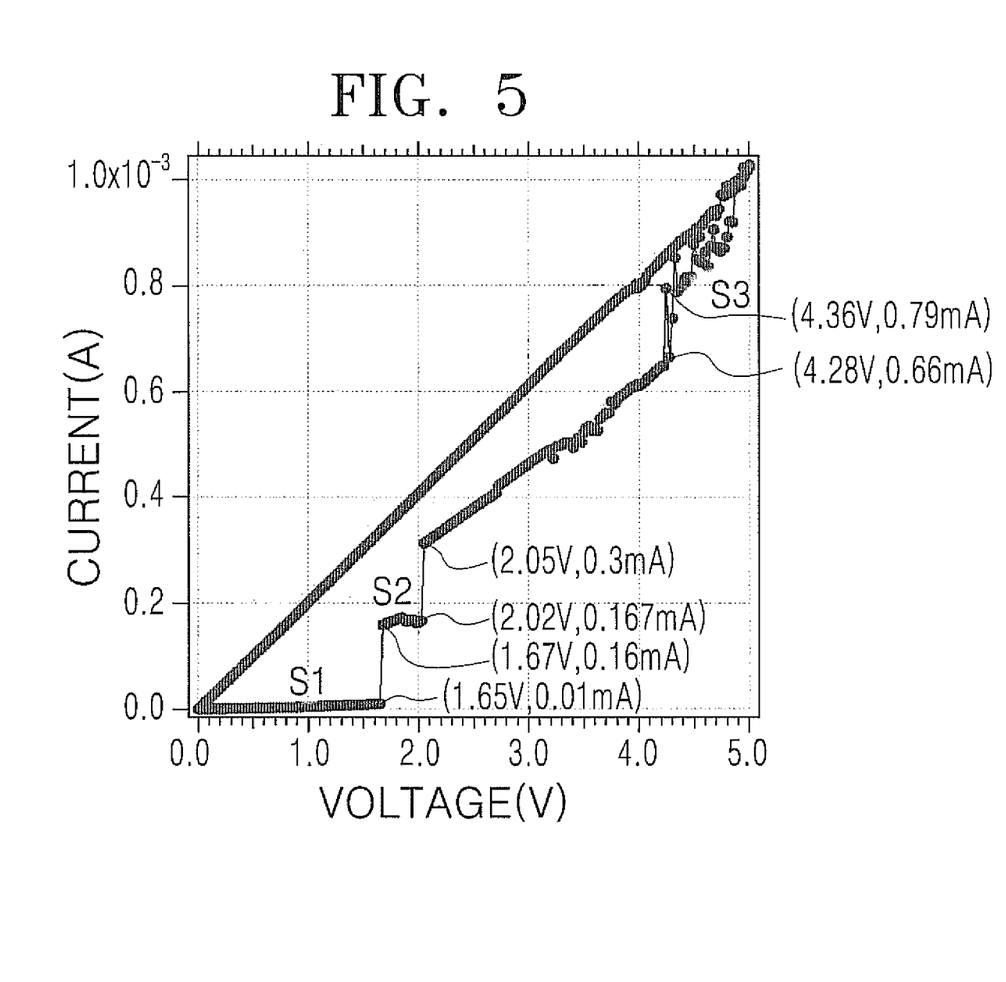
FIG. 5 is a graph representing I-V characteristic of a memory cell including a phase-change material layer according to an exemplary embodiment of the present invention.

FIG. 5 is a graph representing a current-voltage (I-V) characteristic of a memory cell including the phase-change material layer of the second embodiment.

Referring to FIG. 5, it is observed that current of the phase-change material layer of the second embodiment is increased at voltages of 1.65 V, 2.02 V, and 4.28 V. Current sections S1, S2, and S3 correspond to an amorphous state S1; an $Sb_4Se_4$ monoclinic crystal structure S2; and an $Sb_4Se_4$ orthorhombic crystal structure (in which Sb rhombohedral crystal structure may be further included) S3 depending on a crystallization sequence according to increase in a temperature, respectively, and have distinguishable resistive states from one another. Three resistive states enable to correspond to the bit information and thus multi-bit recording density may be obtained. In terms of driving of the variable resistive memory device, the S1 state may be a reset state and the S2 and S3 states may be a first set state and a second set state, respectively.

As described above, the $Sb_4Se_4$ monoclinic crystal structure is dominantly generated when the stoichiometry m:n of the $Sb_mSe_n$ material layer satisfy m=n or m>n. According to an example, the $Sb_4Se_4$ monoclinic crystal structure may be dominantly generated when m=n. It can be seen from the comparative example that although the $Sb_mSe_n$ material layer has the stoichiometry m:n of 1:1, the $Sb_4Se_4$ monoclinic crystal structure which is the metastable crystalline phase is not represented when an contact interface by separation between the Sb atoms and the Se atoms is not present in $Sb_mSe_n$ material layer.

The first to third phase-change material layers of the above-described exemplary embodiments has been illustrated that the layer of the plurality of Sb atoms and the layer of the plurality of Se atoms come in contact with each other so that the contact interface is provided by the surface contact of the layers in the phase-change material layer structure. However, as described above, any one of Sb atoms and the group of Se atoms may have a layer structure and the other may be dispersed within the layer structure and clustered by a segregation (or, agglomeration) reaction so that the plurality of Sb atoms and the plurality of Se atoms are phase-separated. Therefore, a contact interface capable of obtaining the $Sb_4Se_4$ monoclinic crystal structure may be provided within the phase-change material layer.

The present invention is not limited to an embodiment where features of the above-described stoichiometry and layer structure are implemented in the entire phase-change material layer. Even when the features may be implemented in a portion of the phase-change material layer, for example, only in the active region, the same or similar effect may be obtained.

Figure 6:
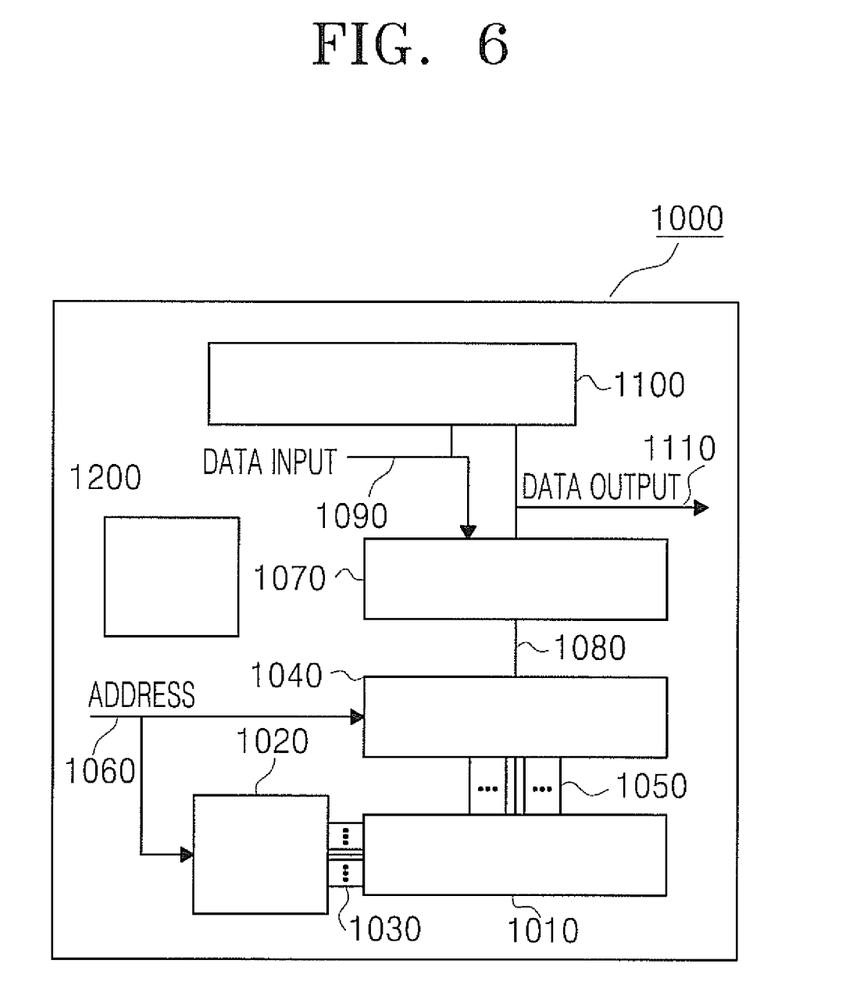
FIG. 6 is a block diagram illustrating a variable resistive memory device including an array of memory cells according to an exemplary embodiment of the present invention.

FIG. 6 is a block diagram illustrating a variable resistive memory device 1000 including an array 1010 of memory cells according to an exemplary embodiment of the present invention.

Referring to FIG. 6, a word line decoder/driver 1020 is electrically connected to a plurality of word lines 1030. A bit line decoder 1040 is electrically connected to a plurality of bit lines 1050 to input/read out data to/from the memory cells (see 100A of FIG. 1A) in the array 1010. Addresses may be transmitted to the word line decoder/driver 1020 and the bit line decoder 1040 through a bus 1060. A sense amplifier/data input device 1070 may be coupled to the bit line decoder 1040 through a data bus 1080. Data may be provided from input/output (I/O) terminals of the memory device 1000 to the sense amplifier/data input device 1070 through a data input line 1090.

In some exemplary embodiments, an operation circuit 1100 such as a general-purpose processor or a special-purpose processor may be inserted in the variable resistive memory device 1000. Data may be transmitted to the outside or inside of the variable resistive memory device 1000 through a data output line 1110. A controller 1200 may control voltage pulses such as a read voltage pulse, a set pulse, and a reset pulse input to the array 1010 of the memory cells.

The various phase-change material layers described with reference to the figures may be applied as variable resistive memory devices as well as a fuse structure such as a fuse or an antifuse or a logic gate of a logic device such as a field programmable gate array as a resistor. In addition, the variable resistive memory devices having memory cells described with reference to the appended drawings herein may be implemented with a single memory device or a system on chip (SOC) type together with heterogeneous devices, for example, logic processors, image sensors, or radio frequency (RF) devices in one wafer chip. The variable resistive memory devices may be implemented with one chip type by bonding a wafer chip in which the variable resistive memory device is formed to another wafer chip in which the heterogeneous device is formed using an adhesive, soldering, or wafer bonding technology.

In addition, the variable resistive memory devices according to the above-described exemplary embodiments may be implemented with various types of semiconductor packages. For example, the variable resistive memory devices according to the exemplary embodiments may be packaged in a manner such as package on package (PoP), ball grid array (BGA), chip scale package (CSP), plastic leaded chip carrier (PLCC), plastic dual in-line packages (PDIP), die in waffle pack, die in wafer FoSM, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system In package (SIP), multi chip package (MCP), wafer-level fabricated package (WFP), or wafer-level processed stack package (WSP). The packages mounted with variable resistive memory devices according to the exemplary embodiments may further include controllers and/or logic devices configured to control the variable resistive memory devices.

According to other exemplary embodiments, an electronic system including the variable resistive memory device may be provided. The electronic system may be applied to a personal digital assistant (PDA), a portable computer, a tablet personal computer (PC), a wireless phone, a mobile phone, a digital music player, a memory card, a solid state drive (SSD), or any electronic product capable of transmitting and/or receiving information in a wireless environment.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A variable resistive memory device, comprising:
an array of a plurality of memory cells,
wherein each of the plurality of memory cells includes:
first and second electrodes; and
a phase change material layer interposed between the first electrode and the second electrode,
wherein the phase change material layer includes a separation structure in which a first layer of a plurality of Sb atoms are in contact with a second layer of a plurality of Se atoms to form a contact interface therebetween, and
wherein the phase change material layer includes a phase of $Sb_4Se_4$ monoclinic crystal structure.

2. The variable resistive memory device of claim 1, wherein in the phase change material layer, a ratio m:n of the Sb atoms and the Se atoms satisfies m>n.

3. The variable resistive memory device of claim 1, wherein in the phase change material layer, a ratio m:n of the Sb atoms and the Se atoms satisfies m=n.

4. The variable resistive memory device of claim 1, further comprising a circuit configured to have a programming mode which applies a set pulse and a reset pulse to the array of the plurality of memory cells and applies a first set pulse for forming the phase of $Sb_4Se_4$ monoclinic crystal structure to the phase change material layer.

5. The variable resistive memory device of claim 4, wherein the circuit is configured to apply a second set pulse for forming an $Sb_2Se_3$ orthorhombic crystal structure to the phase change material layer.

6. The variable resistive memory device of claim 4, wherein the circuit is configured to apply the first and second set pulses to heat the phase change material layer to a range of 170° C. to 280° C.

7. The variable resistive memory device of claim 1, wherein the first layer of the plurality of Sb atoms and the second layer of the plurality of Sb atoms are alternately stacked.

8. The variable resistive memory device of claim 1, wherein the memory cell further includes an additional phase-change material layer between any one of the first and second electrodes and the phase change material layer.

9. The variable resistive memory device of claim 8, wherein the additional phase-change material layer includes any one selected from the group consisting of $Ge_2Sb_2Te_5$, $In_{0.5}Sb_2Te_{2.9}$, $Sb_2Te_3$, $Ge_{7.5}Sb_{92.5}$, $GeSb_2Te_3$, $GeSb_2Te_4$, BiSe, GeTeAs, GeSnTe, SeSnTe, GaSeTe, GeTeSnAu, $SeSb_2$, InSe, GeTe, BiSeSb, PdTeGeSn, InSeTiCo, InSbTe, $In_3SbTe_2$, $GeTeSb_2$, $GeTe_3Sb$, GeSbTePd, and AgInSbTe or a combination thereof.

10. A variable resistive memory device, comprising:
an array of a plurality of memory cells,
wherein each of the plurality of memory cells includes;
first and second electrodes; and
a phase change material layer interposed between the first electrode and the second electrode,
wherein the phase change material layer includes a separation structure in which a first layer of a plurality of Sb atoms are in contact with a second layer of a plurality of Se atoms to form contact interface therebetween, and
wherein first bit information is allocated to a first resistance value by an $Sb_4Se_4$ monoclinic crystal structure generated by applying a first set pulse to the phase change material layer.

11. The variable resistive memory device of claim 10, wherein second bit information is allocated to a second resistance value by an $Sb_2Se_3$ orthorhombic crystal structure generated by applying a second set pulse to the phase change material layer.

12. The variable resistive memory device of claim 11, wherein each of the memory cells further includes an additional phase-change material layer between any one of the first and second electrodes and the phase change material layer.

13. The variable resistive memory device of claim 12, wherein the additional phase-change material layer includes any one selected from the group consisting of $Ge_2Sb_2Te_5$, $In_{0.5}Sb_2Te_{2.9}$, $Sb_2Te_3$, $Ge_{7.5}Sb_{92.5}$, $GeSb_2Te_3$, $GeSb_2Te_4$, BiSe, GeTeAs, GeSnTe, SeSnTe, GaSeTe, GeTeSnAu, $SeSb_2$, InSe, GeTe, BiSeSb, PdTeGeSn, InSeTiCo, InSbTe, $In_3SbTe_2$, $GeTeSb_2$, $GeTe_3Sb$, GeSbTePd, and AgInSbTe or a combination thereof.

14. A method of manufacturing a variable resistive memory device, the method comprising:
forming a first electrode;
forming a phase change material layer on the first electrode; and
forming a second electrode on the phase change material layer,
wherein the phase change material layer includes a separation structure in which a first layer of a plurality of Sb atoms are in contact with a second layer of a plurality of Se atoms to form contact interface therebetween, and
wherein the phase change material layer includes a phase of $Sb_4Se_4$ monoclinic crystal structure.

15. The method of claim 14, wherein the Raffling a phase change material layer includes alternately stacking the first layer of the plurality of Sb atoms and the second layer of the plurality of Se atoms.

16. The method of claim 14, wherein in the phase change material layer, a ratio m:n of the Sb atoms and the Se atoms satisfies m<n.

17. The method of claim 14, wherein in the phase change material layer, a ratio m:n of the Sb atoms and the Se atoms satisfies m=n.

18. The method of claim 14, wherein the forming a phase change material layer is performed by any one selected from the group consisting of an effusion cell method, a molecular beam epitaxy, and an atomic layer deposition or a combination thereof.

* * * * *